United States Patent [19]

Verkuil

[11] Patent Number: 5,216,362
[45] Date of Patent: Jun. 1, 1993

[54] CONTACTLESS TECHNIQUE FOR MEASURING EPITAXIAL DOPANT CONCENTRATION PROFILES IN SEMICONDUCTOR WAFERS

[75] Inventor: Roger L. Verkuil, Wappinger Falls, N.Y.

[73] Assignee: International Business Machines Corporation, Armonk, N.Y.

[21] Appl. No.: 774,532

[22] Filed: Oct. 8, 1991

[51] Int. Cl.⁵ .................. G01R 31/26; G01R 31/28
[52] U.S. Cl. ..................... 324/158 D; 250/492.2; 324/158 R
[58] Field of Search .......... 324/158 D, 158 T, 158 R, 324/73.1; 250/492.2

[56] References Cited
U.S. PATENT DOCUMENTS

3,995,216 11/1976 Yun ............................. 324/158 R
4,812,756 3/1989 Curtis et al. ..................... 324/158 D Primary Examiner—Ernest F. Karlsen
Attorney, Agent, or Firm—Whitham & Marhoefer

[57] ABSTRACT

The dopant concentration of a semiconductor wafer is determined using a contactless technique. First, a temporary P-N junction is formed in the surface of the semiconductor wafer using corona discharge. Then, the area of the junction is measured, and the depletion region is deepened, again by corona discharge. The depletion region is collapsed using light, and as the depletion region collapses, the surface potential is measured as a function of time. The charge which drains as the depletion layer collapses is directly proportional to the change in time. Since the total charge is known from the original corona discharge used to establish the depletion layer, as are the unit area and the surface voltage, the dopant profile is directly calculatable as a function of the surface voltage and the charge per unit area.

6 Claims, 12 Drawing Sheets

SUSCEPTOR B (TOP TIER)

|  | MOS | COS | MOS |
|---|---|---|---|
| Cs (E16) | 2.27 | 2.18 | 2.19 |
| SLOPE (E15) | -1.13 | -1.14 | -0.83 |

FIG. 9B

SUSCEPTOR A (BOTTOM TIER)

|  | MOS | COS | MOS |
|---|---|---|---|
| Cs (E16) | 1.96 | 1.82 | 1.86 |
| SLOPE (E15) | +0.86 | +1.21 | +2.13 |

CONTACTLESS TECHNIQUE FOR MEASURING EPITAXIAL DOPANT CONCENTRATION PROFILES IN SEMICONDUCTOR WAFERS

BACKGROUND OF THE INVENTION

1. Field of the Invention

The present invention generally relates to the field of semiconductor wafer testing and, more particularly, to a non-contact method for measuring epitaxial dopant concentration profiles in such wafers.

2. Description of the Prior Art

Currently, Metal Oxide Semiconductor (MOS) Pulsed Capacitance-Voltage (C-V) doping concentration profiles are used to control epitaxial silicon process sectors. The MOS method is described, for example, by E.H. Nicollian and J.R. Brews in *MOS Physics and Technology*, John Wiley and Sons (1982), at pages 383–406, and provides repeatable, accurate profiles. However, MOS sample preparation is expensive, time consuming and destructive. Labor and equipment is need ed for depositing front-side aluminum dots and back-side blanket aluminum. Several days of turn around time usually result from wafer queuing and processing for the aluminum steps. Also, the destructive nature of the sample preparation forces the undesirable use of expensive monitor wafers which are not completely representative of product wafers.

SUMMARY OF THE INVENTION

It is therefore an object of the present invention to provide an improved method for the measurement of epitaxial dopant concentration profiles which eliminates the time delays of the current measuring techniques.

It is another object of the invention to provide a new technique for the measurement of epitaxial dopant concentration in semiconductor wafers which eliminates the uncertainty between monitor and product wafers.

According to the invention, there is provided a procedure for non-destructively measuring epitaxial doping concentration profiles immediately after the standard epitaxial re-oxidation step. The invention requires no sample preparation, but rather uses a new electronic technique that exploits the minority photocarrier barrier from the buried $N^-/N+$ ($N^-$ epi/$N+$ subcollector) junction under the epitaxial layer. This facilitates the novel generation of doping profiles from an analysis of light induced collapse of silicon deep depletion as opposed to analyzing the conventional voltage induced extent of silicon deep depletion.

This invention is a major advance over the contactless means of measuring average epitaxial doping concentration, as opposed to an actual doping profile, as described in U.S. Pat. No. 4,812,756 to Curtis et al. In that patent, sequential corona discharges are used to establish a P-N junction in a semiconductor substrate. Corona discharge is again used to deepen the depletion region under the junction, and the surface potential is measured The surface potential and corona discharge are used to obtain an average dopant concentration of the depletion region. This invention uses the same hardware to obtain a more precise dopant concentration profile.

More particularly, in the present invention, a temporary corona oxide semiconductor (COS) P-N junction is formed in the surface of the semiconductor wafer using corona discharge, as in the prior Curtis et al. technique. Then, the area of the junction is measured. This is a new step allowing for the later calculation of the profile. Next, the depletion region is deepened, again by corona discharge as in the prior Curtis et al. technique. The depletion region is then collapsed using light. This also is a new step which, again, is important for the later calculation of the profile. As the depletion region collapses, the surface potential is measured as a function of time. The charge which drains as the depletion layer collapses is directly proportional to the change in time.

Since the total deep depletion charge is known from the original corona discharge used to establish the deep depletion layer, as are the unit area and the surface voltage, the dopant profile is directly calculatable as a function of the time varying surface voltage and the charge per unit area.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Apparatus

Figure 1:
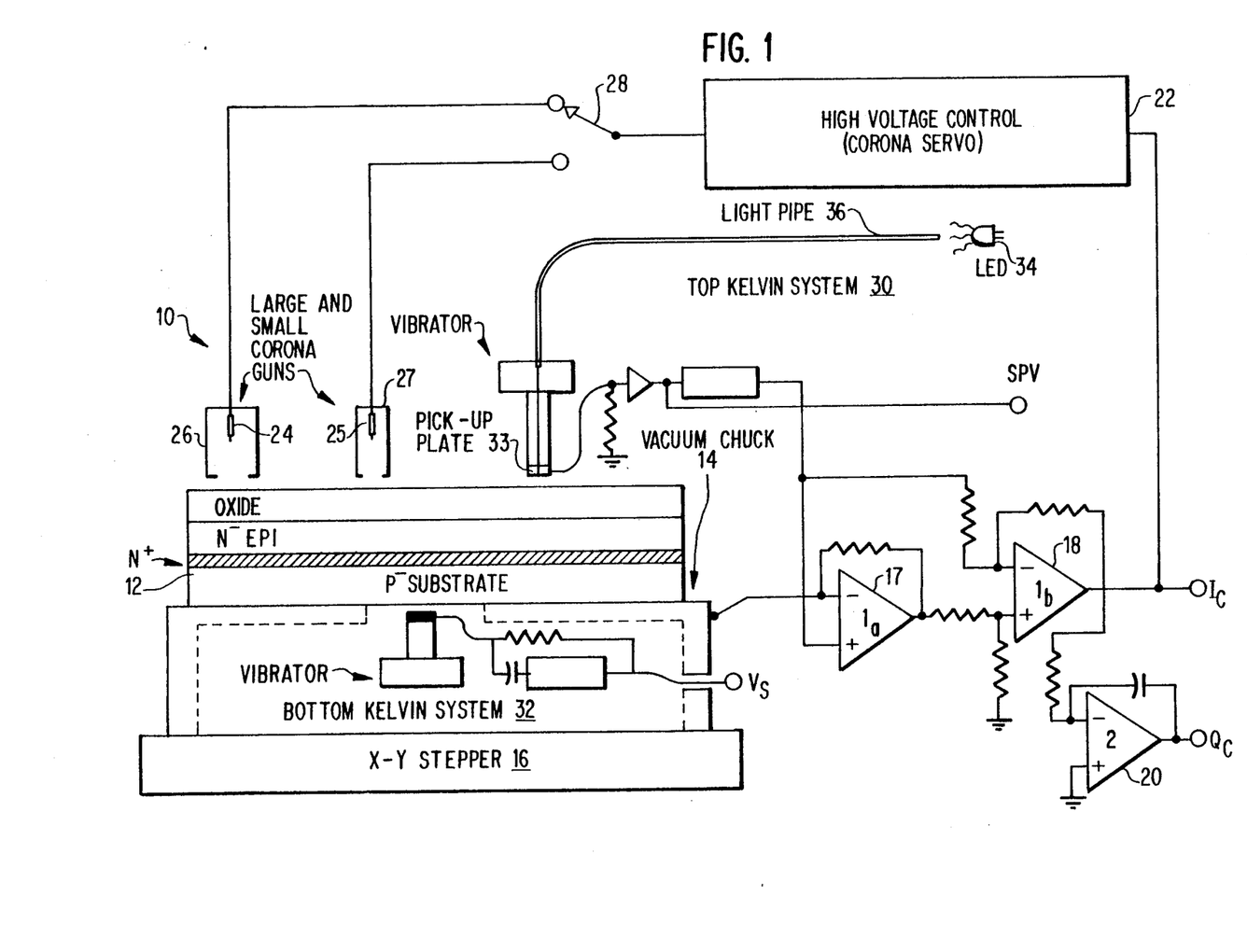
FIG. 1 is a schematic diagram illustrating the doping measurement apparatus according to the invention with a post $N^-$ epitaxial re-oxidation product wafer on a product chuck.

Referring now to the drawings, and more particularly to FIG. 1, there is shown the doping measurement apparatus 10. This apparatus is essentially the same as that disclosed in the aforementioned U.S. Pat. No. 4,812,756 to Curtis et al. A post $N^-$ epi re-oxidation product wafer 12 on a vacuum chuck 14 which rides on an X-y stepper 16 permitting selected regions on the wafer surface to be exposed to both large and small aperture corona discharge sources (i.e., guns). The corona current, $I_c$, from the corona guns flows into the wafer 12 and then into the chuck 14. This current is converted to a voltage by operational amplifiers 17 and 18 and then integrated by operational amplifier 20 to generate a voltage proportional to the coulombs of corona charge, $Q_c$, deposited on the oxide surface of the wafer under test. The current, $I_c$, is fed back to the high voltage control circuit 22, connected to a sharp needle 24 or 25 of large and small corona guns 26 and 27, in order to form a constant corona current servo. The large or small corona guns are selected by a switch 28 connected to the output of the high voltage control circuit 22.

Top and bottom vibrating Kelvin Probe systems 30 and 32, respectively, are capacitively coupled to the wafer 12 across an approximate 5 mil air gap. This Dual Kelvin System acts as a differential electro-static voltmeter for measuring the front-side surface potential of the wafer 12 with respect to the back-side. This differential mode eliminates the need for a back-side ohmic contact to the wafer and allows front-side time dependent and steady state changes in oxide potential, $V_{ox}$, and silicon surface potential, $V_{si}$, to be conveniently observed. The capacitive pick-up plate 33 of the top Kelvin system 30 is also used for sensing small signal light induced surface potentials. Light excitation is provided by an LED 34 via the small diameter, concentric light pipe 36 built into the capacitive pick-up plate 33.

Procedure

Step 1—Form a P-N Junction

Figure 2:
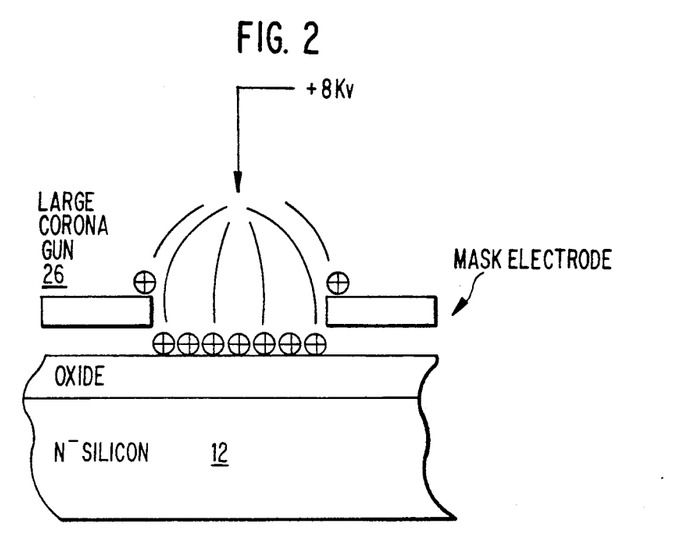
FIG. 2 is a schematic diagram of a cross-section of an oxide-semiconductor structure after a positive corona discharge step to accumulate the silicon surface.
Figure 3:
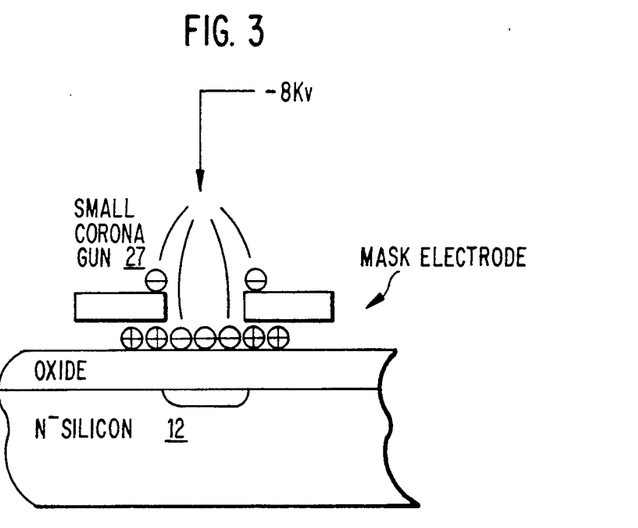
FIG. 3 is a schematic diagram of a cross-section of an oxide-semiconductor structure after a negative corona discharge step to invert the silicon surface.
Figure 4:
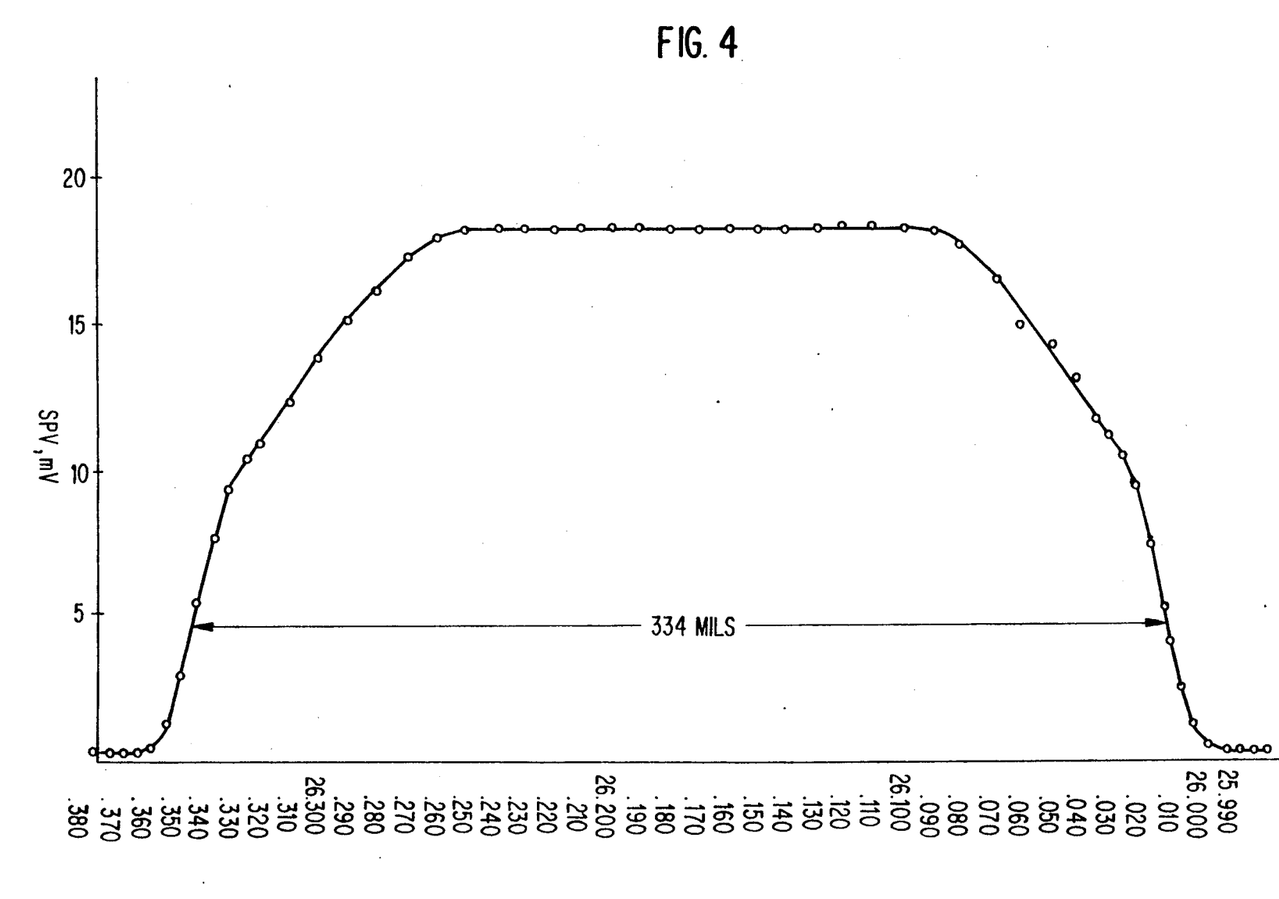
FIG. 4 is a graph showing the results of a scanned surface photovoltage (SPV) measurement of a corona induced P-N junction diameter.

Referring now to FIG. 2, a selected region of wafer 12 to be profiled is first moved under the large corona gun 26 in order to deposit positively ionized air to accumulate a 0.75 inch diameter area. For a typical 1600 Angstrom oxide thickness, the large gun 26 is used to charge up the oxide surface to about $+10$ volts. Next, in FIG. 3, this accumulated region is then moved under a small corona gun 27 in order to invert a concentric 0.375 inch diameter area due to deposition of negatively ionized air. Again, for a typical 1600 Angstrom oxide thickness, the small gun 27 would be used to charge up the oxide surface to about $-15$ volts.

Step 2—Measure Diameter of P-N Junction

The diameter of the corona field-induced P-N junction is approximately equal to the diameter of the mask of the small corona gun 27, but that is not accurate enough. A sufficiently accurate measurement of diameter is obtained by scanning the junction, formed in step 1, with the small light spot shown in FIG. 1. During the scan, the LED 34 is driven with a 20–50 Hz a.c. current source, and the resultant small signal, a.c. surface photovoltage, SPV, is coupled to the capacitive pick-up plate 33 of the Top Kelvin Probe 30. The a.c. output signal from the pick-up plate 33 is amplified by high impedance operational amplifier 38.

A typical SPV scan is shown in FIG. 4, and FIGS. 5A to 5C show how this scanned SPV behavior is used to determine junction diameter. As the concentric light spot/pick-up plate assembly 33 scans the junction from center to edge, the SPV is first constant in FIG. 5A and then starts dropping in FIG. 5B due to reduced capacitive coupling; i.e., due to a reduction of pick-up plate area directly above the junction area. Finally, in FIG. 5C the SPV drops even more steeply when both the pick-up plate 33 and light spot are no longer directly above the junction area.

Figure 5A:
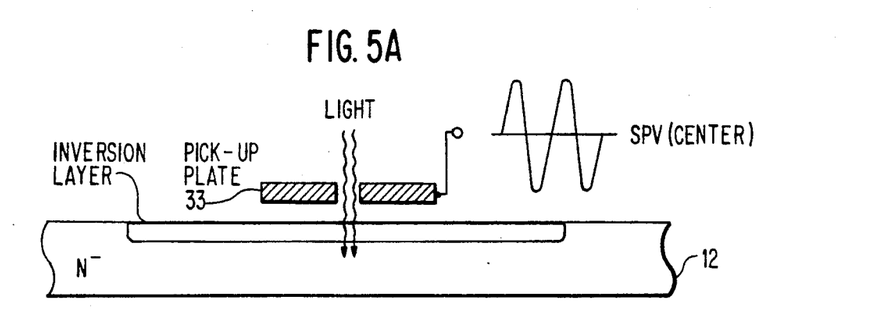
FIGS. 5A, 5B and 5C are schematic diagrams of a cross-section of an oxide-semiconductor structure illustrating the measurement of the P-N junction diameter by means of scanned surface photovoltage (SPV) behavior.
Figure 5B:
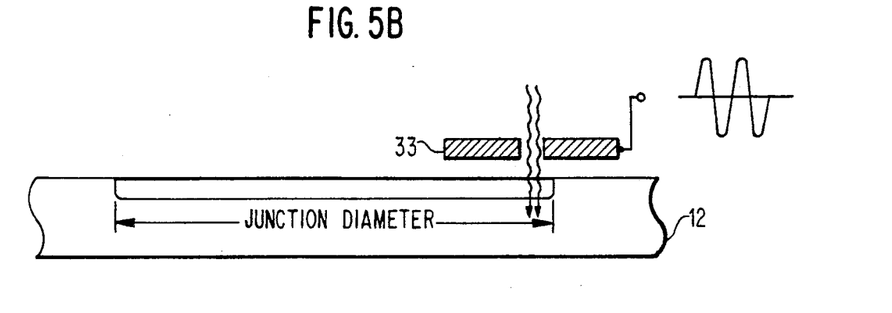
Figure 5C:
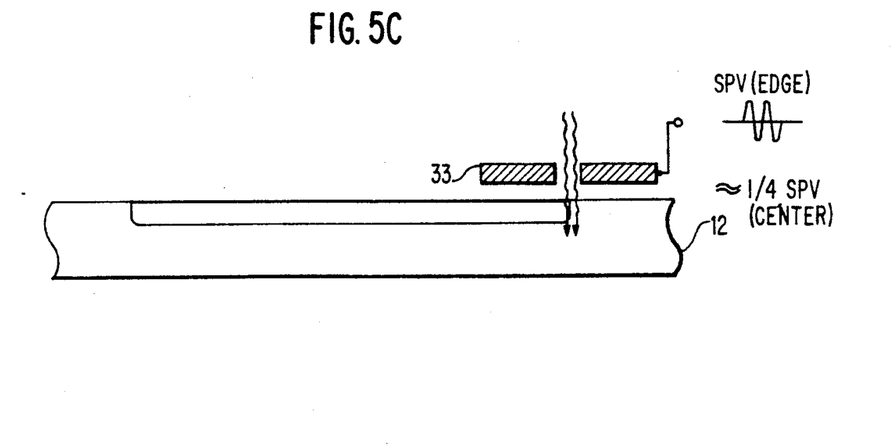

When the center of the light spot and pick-up plate assembly 33 is directly above the junction diameter, the capacitive coupling and the junction illumination will both be about one half the center value and, therefore, the SPV will be about one quarter or 25% of the center value. More precisely, the junction diameter is defined as twice the distance between the center of the junction and the point where the SPV drops to 22.7% of its center value. This follows from simple geometry calculations based on the small signal SPV being linearly proportional to the product of pick-up plate area and light spot area which is directly above the junction area.

Step 3—Pulse Junction Into Deep Depletion

The silicon surface potential of the field induced junction, created by step 1, is first allowed to come to equilibrium in complete darkness by pausing for as long as two minutes. After equilibrium is achieved, the small corona gun 27 is used to pulse the junction into deep depletion. Prior to the deep depletion pulse, the voltage on the lower mask electrode is increased, while also slightly raising the mask. This is done to electrostatically reduce the corona pulsing beam diameter to a value which is less than the junction diameter. This condition is required in order for the output of operational amplifier 20, $Q_c$, to be completely representative of the amount of deposited corona charge which forces the junction into deep depletion. A 400 msec deep depletion pulse width is typically used to deposit a charge density of about $1.7 \times 10^{-7}$ coulombs/cm$^2$ for profiling semiconductor wafers with an $N^-$ epitaxy doping concentration of about 1–2 E16 atoms/cm$^3$.

Step 4—Analyze Deep Depletion Potential Transient

Immediately following the deep depletion corona pulse in step 3, the X-Y stepper 16 rapidly (e.g., $\sim 150$ msecs) moves the deep depleted junction from the small corona gun position to the top Kelvin probe position. The output of the Dual Kelvin System is then fed to a digitizer in order to capture and analyze the typical, resultant transient shown in FIG. 6.

Figure 6:
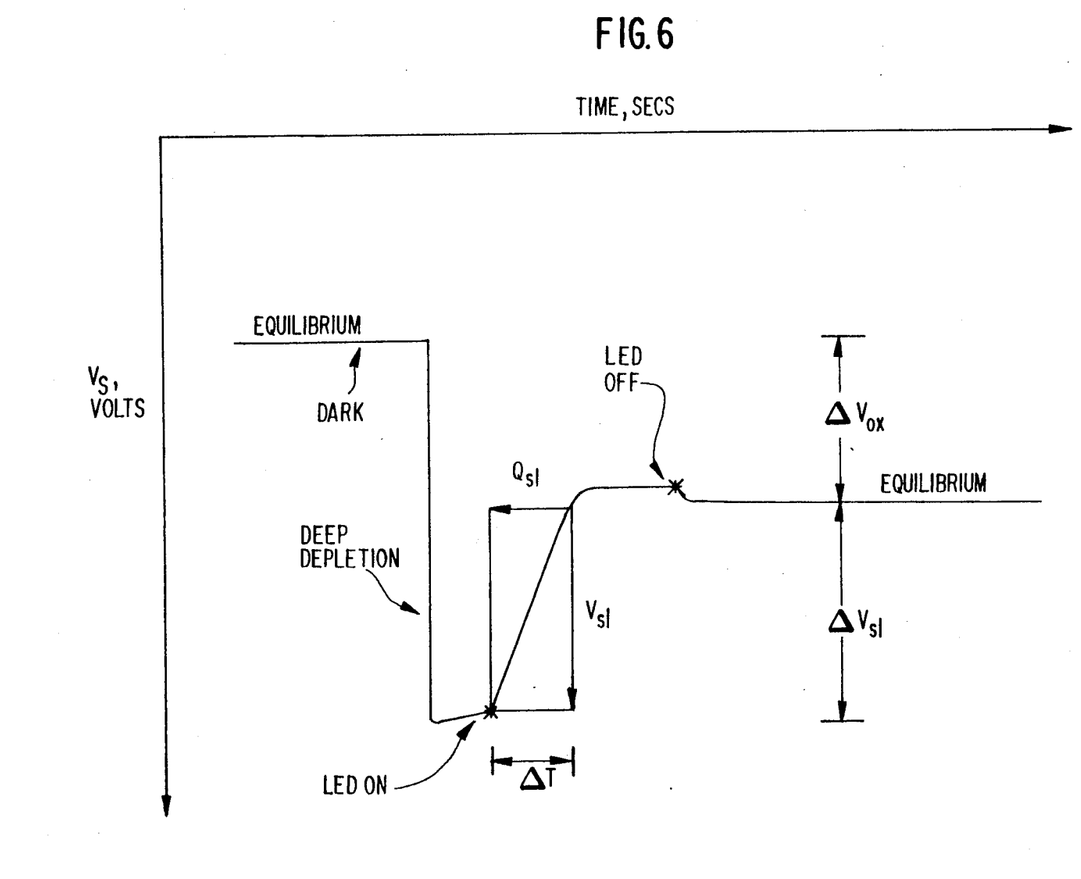
FIG. 6 is a graph illustrating the deep depletion transient showing the increase of oxide and silicon potential due to a negative corona pulse and the subsequent, rapid-light induced collapse of the depletion potential.

FIG. 6 shows the initial instantaneous changes in oxide potential, $\Delta V_{ox}$, and silicon surface potential, $\Delta V_{si}$, immediately following the deep depletion corona pulse. Note the slow decay of $V_{si}$ in the dark and the transition to a much more rapid decay due to illumination from the delayed turn-on of the LED. The rapid decay, during the time interval, $\Delta T$, is of the most interest. During $\Delta T$, the flow of light induced minority carriers to the surface increases the carrier concentration of the surface inversion layer while conservation of charge leads to a corresponding collapse in deep depletion depth. The total collapse of deep depletion occurs at the end of $\Delta T$ when the silicon surface potential, $V_{si}$, reaches its former equilibrium value in the dark. At this instant, also from conservation of charge, the minority photocarrier concentration that has been building up at the surface will be equal to the total corona charge, $Q_c$, that was used to pulse the silicon into deep depletion.

As will be described in more detail hereinafter, the photocurrent contributing to the minority carrier build-up at the surface can be assumed to be constant. The constant photocurrent assumption is the key to this invention. For a constant photocurrent condition, equal increments of time, during $\Delta T$, will correspond to equal incremental changes of silicon charge, $\Delta Q_{si}$, in the depletion region. Therefore, the $\Delta T$ time interval in FIG. 6 can be broken up into n small time increments which each correspond to a $\Delta Q_{si}$ value of $Q_c/n$. In other words, during $\Delta T$, the $V_{si}$ versus time plot of FIG. 6 can be simply converted to a $V_{si}$ versus $Q_{si}$ plot. From $V_{si}$ versus $Q_{si}$, the instantaneous silicon capacitance, $C_{si}=dQ_{si}/dV_{si}$, can then be readily determined as a function of $V_{si}$. Once $C_{si}$ versus $V_{si}$ is known, then the same profiling theory for conventional MOS pulsed C-V as described by E. H. Nicollian and J. R. Brews, supra, can be employed.

EXPERIMENTAL RESULTS

Figures 7A, 7B:
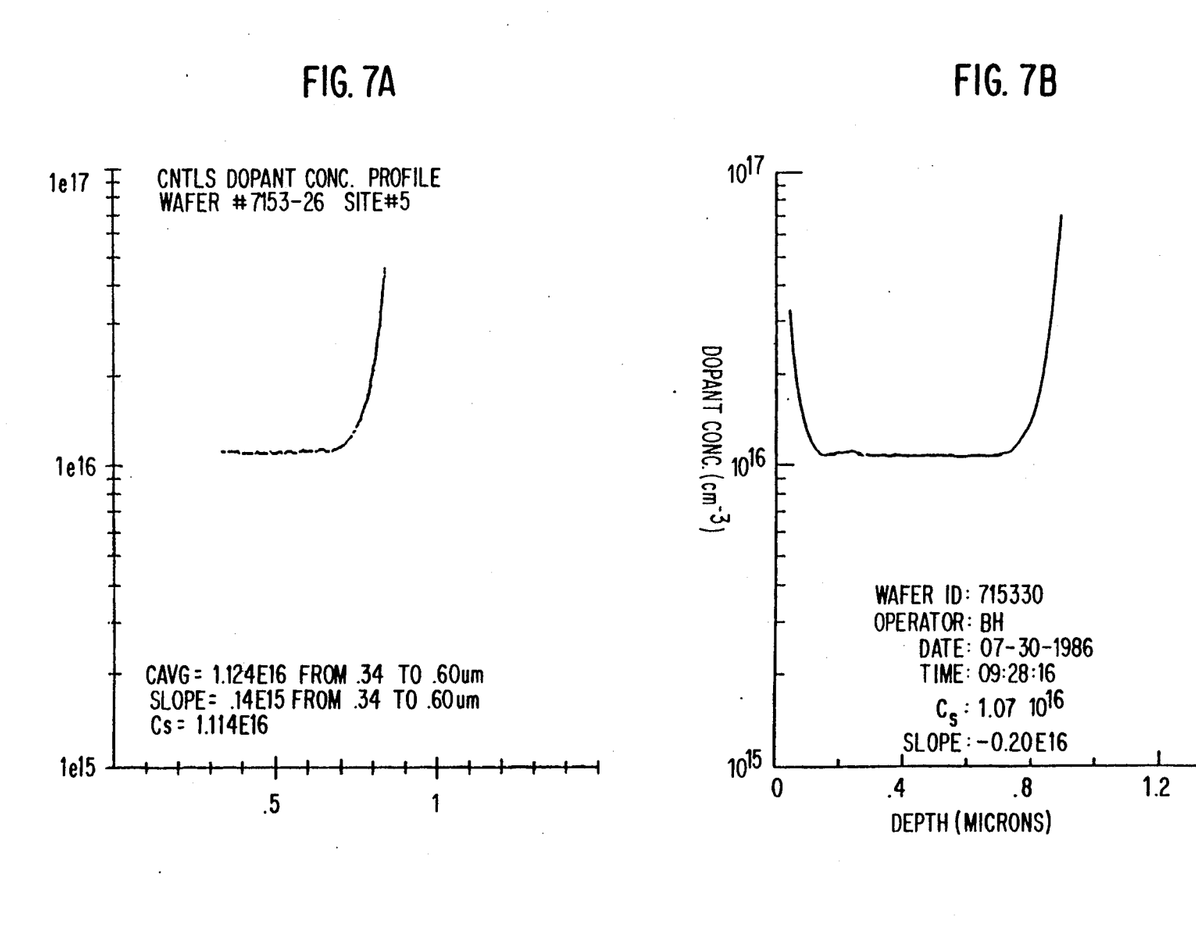
FIGS. 7A and 7B and FIGS. 7C and 7D are graphs each respectively showing side by-side COS and MOS measured dopant profiles of neighboring wafers from two epitaxial runs of a first product using the technique according to the present invention and a prior art technique.
Figure 7C:
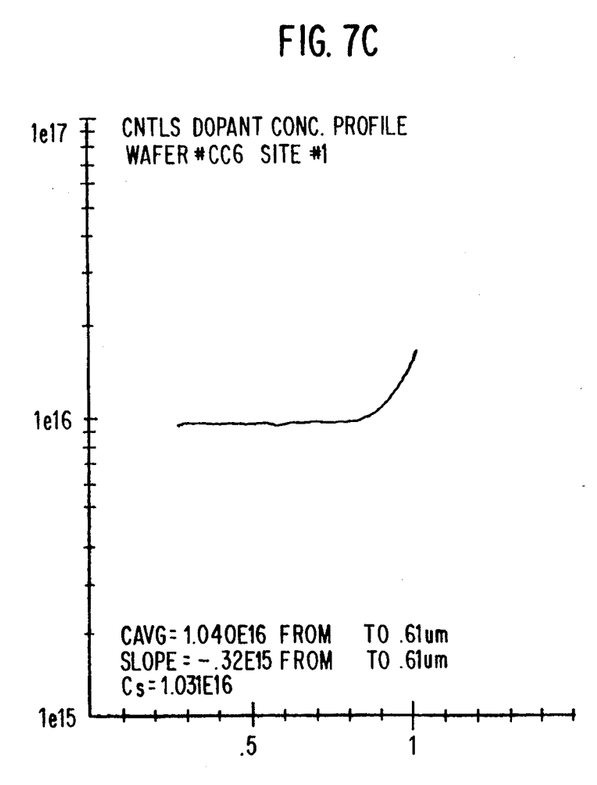
Figure 7D:
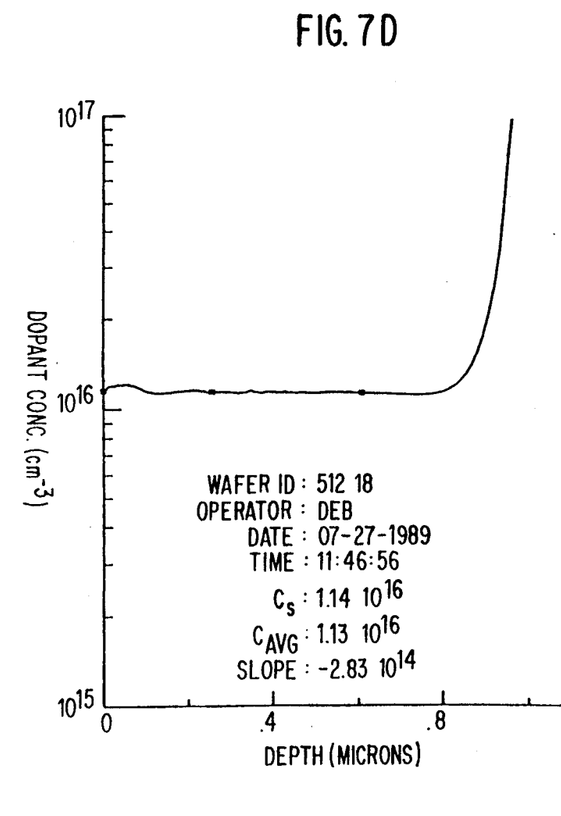
Figure 8A:
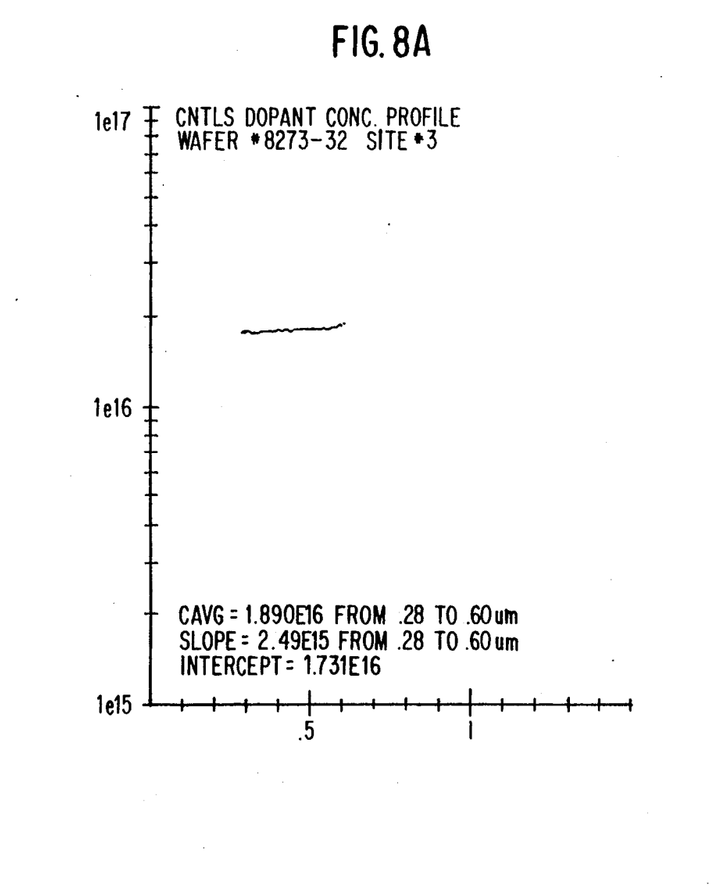
FIGS. 8A and 8B and FIGS. 8C and 8D are graphs each respectively showing side-by-side COS and MOS measured dopant profiles of neighboring wafers from two epitaxial runs of a second product using the technique according to the present invention and a prior art technique.
Figure 8B:
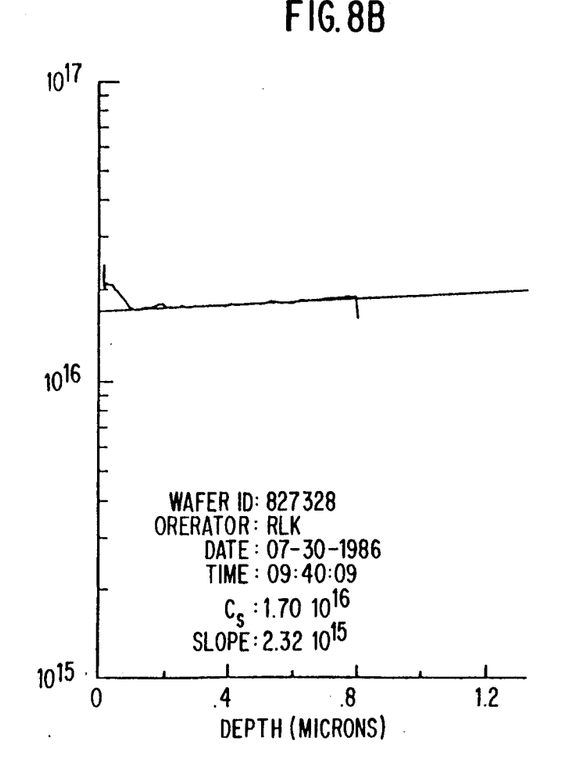
Figure 8C:
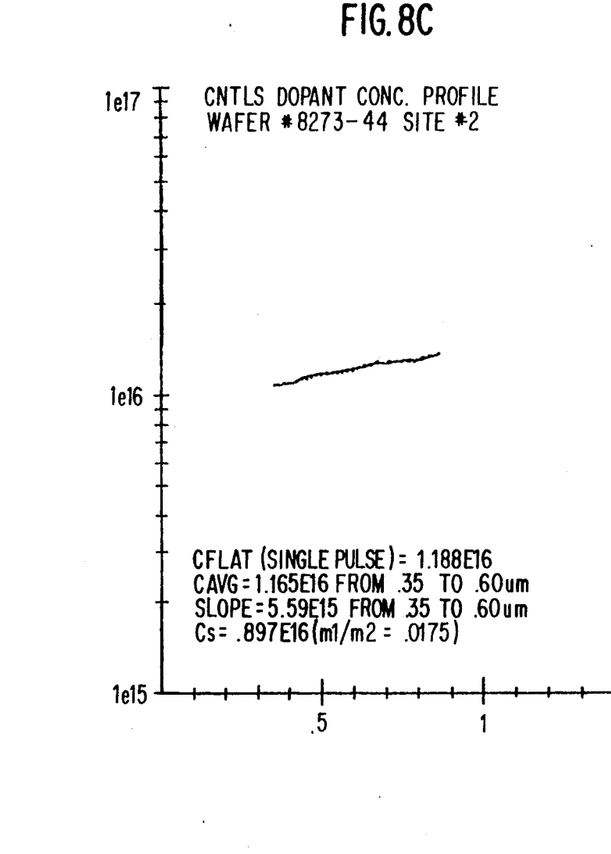
Figure 8D:
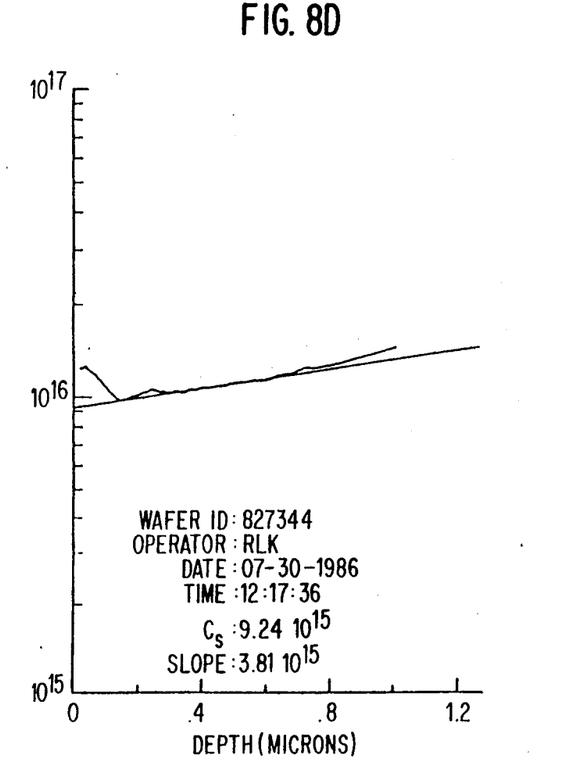
Figure 9A:
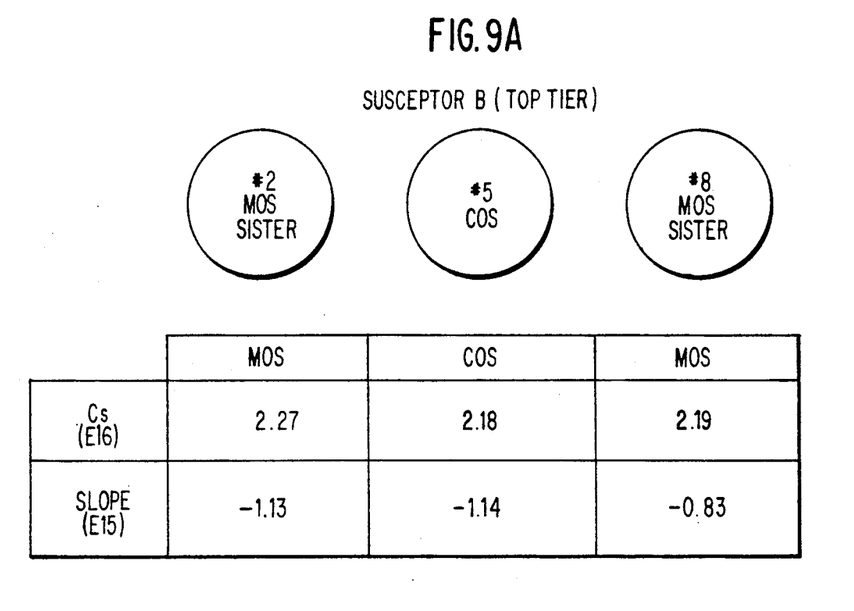
FIGS. 9A and 9B are tables showing surface concentration, Cs, and slope comparisons of MOS and COS dopant concentration profiles taken on neighboring semiconductor wafers from the same epitaxial run.
Figure 9B:
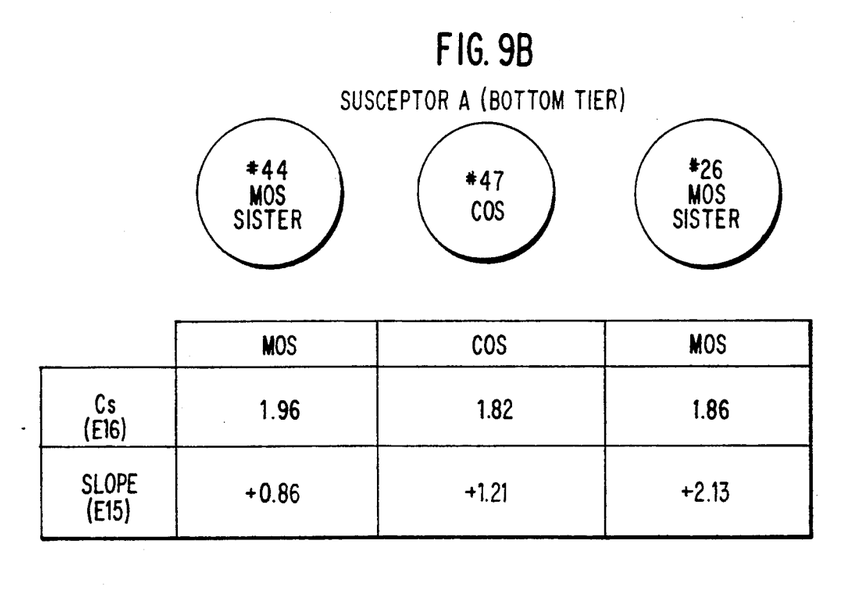
Figure 10A:
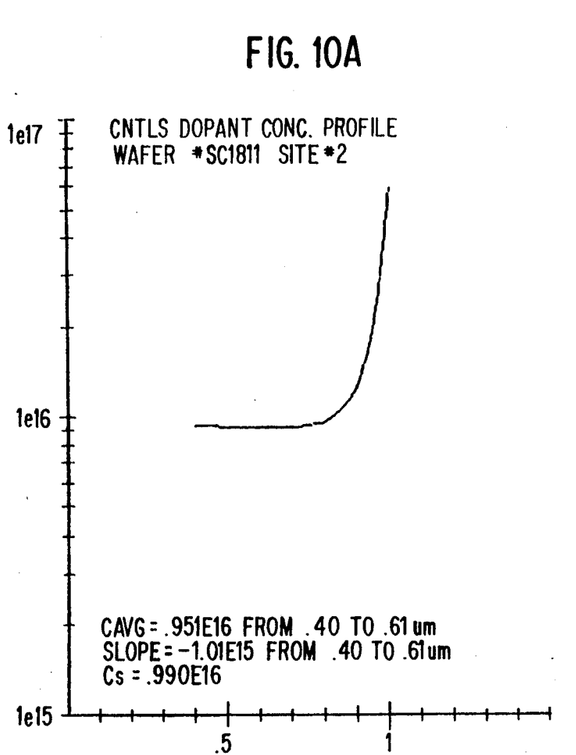
FIGS. 10A, 10B, 10C, and 10D are graphs illustrating the repeatability of COS dopant concentration profile measurements over a period of three months.
Figure 10B:
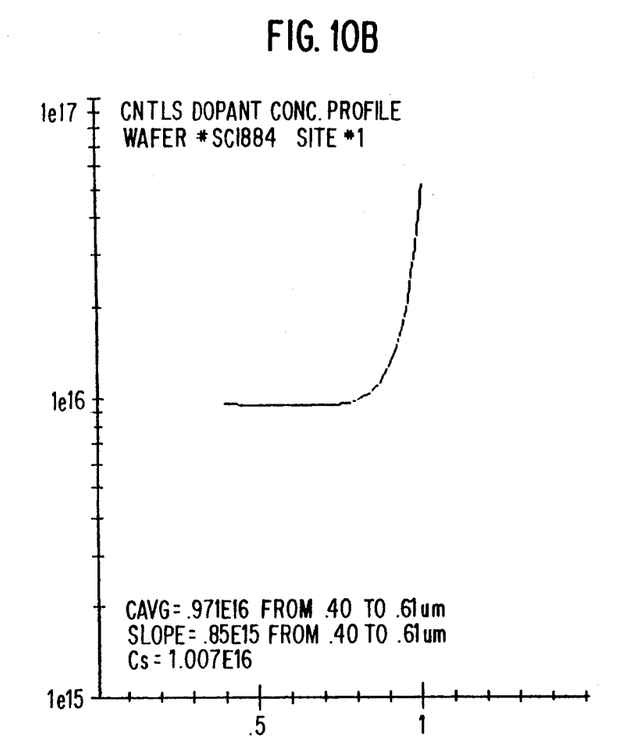
Figure 10C:
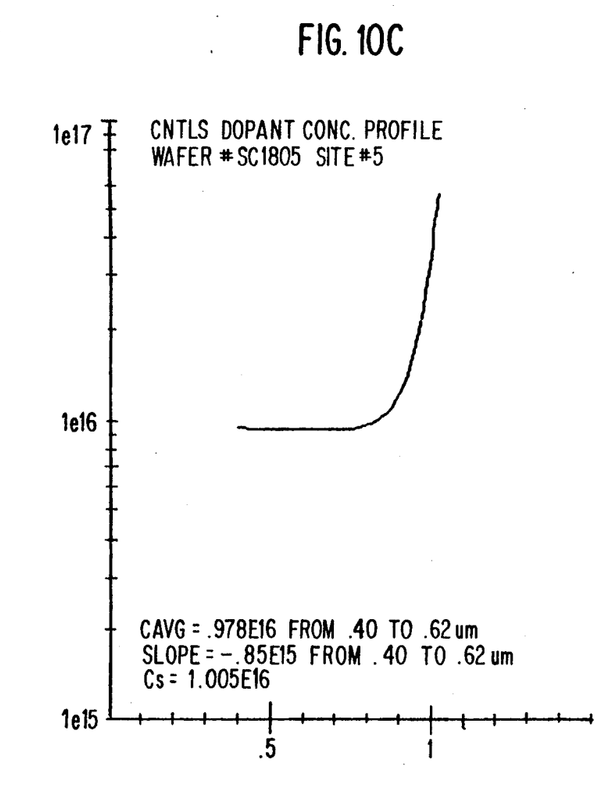
Figure 10D:
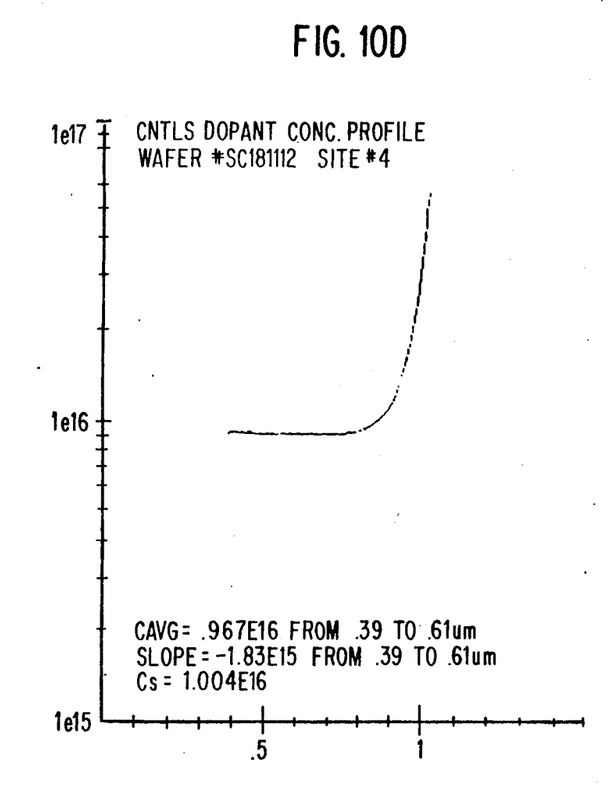

FIGS. 7A and 7B and FIGS. 7C and 7D show side-by-side comparisons of a first product epitaxial doping profiles made with this invention, COS, and the MOS pulsed C-V procedure. FIGS. 7A and 7C show the COS measurements, and FIGS. 7B and 7C show the corresponding MOS measurements. FIGS. 8A and 8B and FIGS. 8C and 8D show similar side-by-side comparison for a second product wafers. FIGS. 9A and 9B show a more quantitative comparison of surface output concentration, Cs, and slope, on two of the second product wafers, relative to MOS pulsed C-V on adjacent wafers in the same epitaxial run. FIG. 10 shows the repeatability of four profiles that were made about three months apart on the same first product wafer.

DISCUSSION

Relative Humidity Conditions 15 to 30 percent relative humidity is preferred but not essential. Minimizing moisture reduces time dependant lateral propagation of corona induced oxide surface potentials in order to create field induced P-N junctions with time invariant diameters.

Constant Photocurrent Assumption

In order to properly assume that constant time increments during the $\Delta T$ portion of FIG. 6 correspond to constant $\Delta Q_{si}$ increments, the photocurrent collected by the corona induced junction must be constant with time and must far exceed the junction leakage current. The junction leakage current will generally not be constant with time, since it will be a function of the changing silicon depletion depth during the decay transient. See, for example, S. M. Sze, *Physics of Semiconductor Devices*, John Wiley and Sons (1986), p. 103. Therefore, if leakage current is allowed to remain significant with respect to photocurrent, large errors will occur in calculated profile slopes. To avoid this problem, junction leakage is rendered negligible by using sufficient light intensity to make the light induced decay rate of $V_{si}$ at least 50 times greater than the leakage controlled decay rate in the dark. The small remaining error, due to leakage, is then further reduced with a small mathematical correction of effective photocurrent. This correction assumes that the initial leakage current, measured in the dark, will reduce linearly to zero with collapsing deep depletion depth.

The validity of the constant photocurrent regime, required for this invention, is based on applying solar cell theory described by Oldwing von Roos in "A Simple Theory of Back Surface Field (BSF) Solar Cells", *J. Appl. Phys.*, 49(6), June 1978, to the corona induced P-N junction on the epitaxial surface of first or second product wafers, post N⁻ epitaxial re-oxidation. The two aspects that are particularly exploited from the von Roos theory are the "Back Surface Field Effect" and the fact that minority carrier diffusion lengths of typical epitaxial layers are long with respect to epitaxial thickness. When photocarriers are created in an epitaxial layer, some photocarriers will diffuse toward the surface and some will diffuse down to the subcollector and be reflected back to the surface by the N⁻ epi/N+ subcollector potential barrier. Since the diffusion distance is so short with respect to the minority carrier diffusion length, essentially all photocarriers generated in both the depleted and non-depleted regions of the epitaxial layer will be collected by the corona induced junction. This should be the case regardless of the changing depletion depth of the junction during the decay. Therefore, as long as the light intensity of the LED is kept constant, the desired constant photocurrent regime required for this invention is maintained during the $V_{si}$ decay transient.

The invention thus exploits a constant photocurrent regime during the light induced collapse of silicon deep depletion to generate contactless epitaxial doping concentration profiles on semiconductor wafers. These doping profiles are generated by analyzing the continuous collapse, as opposed to the stepped increase, of silicon deep depletion from a single deep depletion pulse.

OTHER APPLICATIONS

This invention is not limited to N⁻ epitaxial silicon layers. It is also applicable, for example, to N or P type uniformly doped wafers as well as N or P type ion implanted layers. Such usefulness has been demonstrated over a doping range of 1 E15 to 1 E18 atoms/cm³. Some loss of accuracy is to be expected in cases where the previously mentioned constant photocurrent assumptions are less valid. For P type silicon, all polarities of voltage, current and charge should be reversed with respect to the N type case discussed above.

Thus, while the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A contactless method for measuring dopant concentration in an epitaxial layer of a semiconductor wafer comprising the steps of:
    forming a temporary P-N junction in the surface of the semiconductor wafer by corona discharges;
    measuring the surface area of the temporary P-N junction;
    deepening, by corona discharge, the depletion region under the temporary P-N junction;
    collapsing the depletion layer using a low intensity light while measuring the surface potential of the semiconductor wafer above the temporary P-N junction; and calculating the dopant concentration at each vertical point in the depletion layer region as a function of the surface voltage and charge drained per unit area.

2. The method recited in claim 1 wherein the step of forming a temporary P-N junction comprises the steps of:

depositing charges of a first polarity over an area having a first radius; and depositing charges of a second polarity, different from said first polarity, of a second area concentric with said first area, said second area having a second radius different from said first radius.

3. The method recited in claim 2 wherein the step of measuring the surface area of the temporary P-N junction comprises the step of performing a surface photovoltage scan of a portion of said epitaxial layer.

4. The method recited in claim 3 further comprising the step of allowing a surface potential of said temporary P-N junction to come to equilibrium in complete darkness before the step of deepening the depletion region under the temporary P-N junction.

5. The method recited in claim 4 wherein the step of measuring the surface potential above the temporary P-N junction comprises the step of measuring the time decay rate of a surface potential transient due to the collapsing depletion layer.

6. The method recited in claim 5 further comprising the step of plotting a profile of the dopant concentration in the epitaxial layer.

* * * * *